(12) United States Patent
Naffziger et al.

(10) Patent No.: US 6,643,828 B2
(45) Date of Patent: Nov. 4, 2003

(54) METHOD FOR CONTROLLING CRITICAL CIRCUITS IN THE DESIGN OF INTEGRATED CIRCUITS

(75) Inventors: Samuel D. Naffziger, Fort Collins, CO (US); Wayne D. Kever, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 68 days.

(21) Appl. No.: 10/016,861

(22) Filed: Dec. 14, 2001

(65) Prior Publication Data
US 2003/0115560 A1 Jun. 19, 2003

(51) Int. Cl.$^7$ ............................................. G06F 17/50
(52) U.S. Cl. ............................................................ 716/2
(58) Field of Search .................................... 716/2, 5, 6

(56) References Cited
U.S. PATENT DOCUMENTS 5,802,349 A * 9/1998 Rigg et al. ..................... 716/2

6,470,482 B1 * 10/2002 Rostoker et al. ............... 716/6

OTHER PUBLICATIONS

A. Howard, "An Integrated EDA—Tools Flow Improves Designers' Productivity; an Integrated Front–to–Back Design Flow Improves Quality and Efficiency in the Design of a Prescaler", EDN, vol. 47, No. 12, May 30, 2002, pp. 65–69, and Dialog Accession No. 02616033.

* cited by examiner

Primary Examiner—Matthew Smith
Assistant Examiner—Thuan Do

(57) ABSTRACT

A method of providing critical circuits in a library of circuits, whereby such critical circuits allows designers to apply modifications to them in a controlled manner such that the changes are easy to implement and virtually guaranteed to be correct. The invention comprises a method of performing limited modifications to such critical circuits to alter its characteristics in a controlled manner, and thereafter checking the resulting modified circuit with a circuit simulator for conformance to predetermined specifications that have been assembled for this library critical circuit.

14 Claims, 4 Drawing Sheets

METHOD FOR CONTROLLING CRITICAL CIRCUITS IN THE DESIGN OF INTEGRATED CIRCUITS

BACKGROUND OF THE INVENTION

The present invention generally relates to the design of integrated circuits, and more particularly, to controlling the design of critical circuits that are used in microprocessor and other very large scale integrated (VLSI) circuits.

Microprocessor circuits as well as other VLSI circuits often have particular circuits which are difficult to design correctly, and are therefore deemed to be critical. These types of circuits can include latches, clock generators and specialized logic, such as CAMs, pseudo-NMOS and the like. To meet the relentless performance goals for such VLSI chips, such circuits are necessarily used over large parts of the chips. The particular configuration of each circuit often has to be custom tailored to satisfy the needs of its application in different areas or blocks on the chip. This custom tailoring is very costly in terms of circuit design investment and also in terms of risk to the design, for the reason that it is difficult to assure reliability of the functionality of such critical circuits. This is because there is an increased probability that a designer will introduce an error that will damage the chip functionality with each modification that is made.

Virtually all VLSI designs make use of what is called a "library" of circuits that designers can draw on to implement their logic functions or blocks. These circuits are generally completely fixed, unchangeable quantities that are used as is. There are prior art designs that have made use of some "stretchable" library circuits that allow designers to increase or reduce the size of the circuit based on delay or area requirements. While this can aid the designer in some instances, it is not sufficient to ensure proper functioning of a critical circuit, since fixed sizes, delays and other aspects of these circuits need to be maintained.

Thus, there is a need to provide the performance and density advantages of these critical circuits to the design and control the engineering investment and risk involved in implementing them across the diverse applications on the chip.

SUMMARY OF THE INVENTION

The present invention comprises a method of providing critical circuits in a library whereby such critical circuits allow designers to apply modifications to them in a controlled manner such that the changes are easy to implement and are assured to be correct. The invention comprises a method of performing limited modifications to one or more critical circuits in a controlled manner, and thereafter checking the resulting modified circuit with a circuit simulator for conformance to predetermined specifications that have been assembled for this library critical circuit.

DETAILED DESCRIPTION

As previously stated, the present invention comprises a method of performing limited modifications to a critical circuit that is preferably part of a library of circuits, with the modifications being made to alter the characteristics of the circuit in a controlled manner. The method thereafter comprises checking the resulting modified circuit with a circuit simulator for conformance to predetermined specifications that have been assembled for this library critical circuit. The modifications may comprise one or more of several aspects of modifications, which predominantly involve the layout, i.e., the physical implementation of the circuit components on the silicon of the chip. Modifications can include unique layouts, changing wire widths and lengths, the way the transistors are laid out, as well as the number of vias and contacts that are provided. In addition, and often more importantly, the transistors can have their sizes, their widths and lengths altered to a certain extent, provided the changes maintain the correct circuit behavior.

The checking that is done in accordance with the present invention is done with a circuit simulator, preferably HSPICE or its equivalent, although other circuit simulator tools may be used and are within the scope of the present invention.

Figure 1:
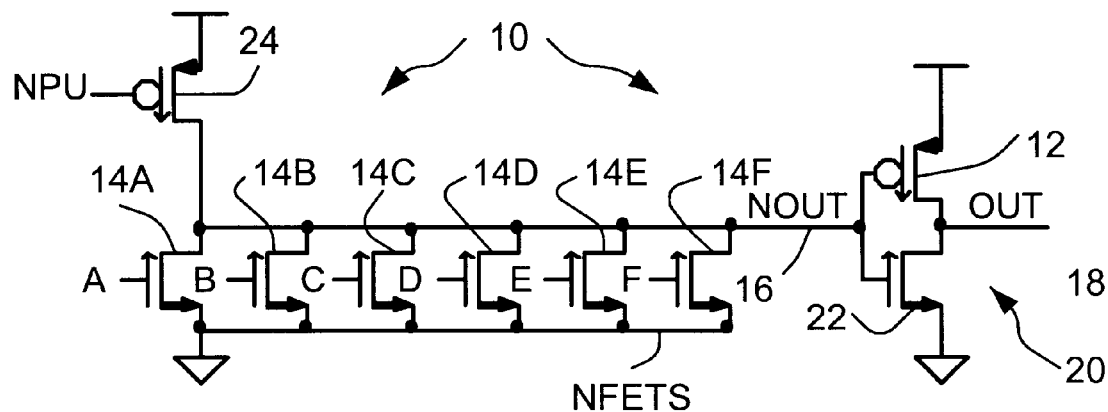
FIG. 1 is an electrical schematic circuit diagram of a pseudo-NMOS gate circuit which can be modified in accordance with the present invention.

Turning now to the drawings, and particularly FIG. 1, a pseudo-NMOS circuit, indicated generally at 10, which functions as an OR gate is shown as an example of a critical circuit that may be modified in accordance with the present invention. This circuit operates by allowing a controlled drive fight between a pull-up PFET 12 and any number of the pull-down NFETs 14A through 14F. If all the NFETs 14A–F are off, the state of nout node 16 will be high or 1 level causing the output 18 of an inverter 20 (comprised of PFET 12 and a NFET 22 connected as shown) to be low. If any of the NFETs 14A-F are on, the nout node 16 will be approximately 0 forcing the output 18 high.

In keeping with the present invention, the critical transistors that can reasonably be sized by designers are pull-up PFETs 12 and 24. These pull-up PFETs 12, 24 can be made weaker or stronger depending on the relative strengths of the NFETs 14A–F, 22 and PFETs 12, 24 as well as based on any parasitic resistance between that pull-up PFET 24 and the pull-down NFETs 14A–F. The output inverter PFET 12 can also be resized based on the above factors to set the trip point of the output inverter 20 to a value optimized to receive the voltage on the nout node 16. Within limits, this trip point can be set to optimize the speed of the gate circuit 10 based on individual applications. For example, if the timing critical usage is for falling inputs (to the NFETs 14A–F), then it is the rising edge of the signal on node 16 that is critical, indicating that a smaller output inverter PFET 12 is best for speed.

After the modifications have been made, the circuit simulator, preferably a SPICE simulator will then need to be run on the circuit to ensure proper operation of the circuit 10 such as proper voltage on node 16, proper resistance limits on node 16, as examples. There are other checks that can be run on circuits of this type, as will be discussed hereinafter with respect to psuedo-dynamic gates of which the pseudo-NMOS 10 is a subset.

Figure 2:
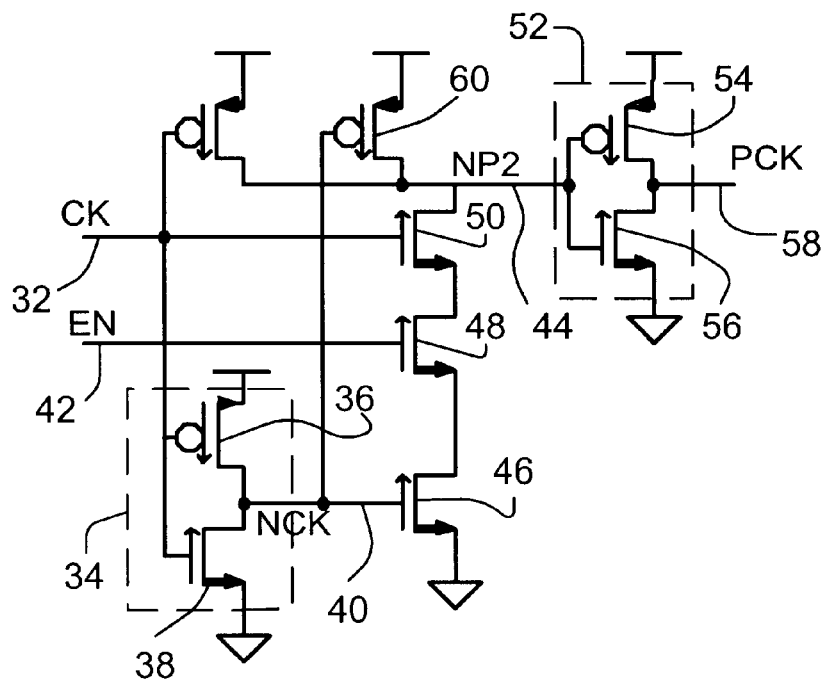
FIG. 2 is an electrical schematic circuit diagram of a pulse generator circuit which can be modified in accordance with the present invention.

Another type of circuit that may be modified in accordance with the present invention is a pulse generator, indicated generally at 30, as shown in FIG. 2. The circuit operates as a one shot multivibrator responsive to a positive transition of a clock (CK) input applied on line 32, that is applied to an inverter 34 that comprises PFET 36 and NFET 38 and having an NCK output 40, with the inverter 34 acting as an inverting delay element. If it is a long delay, then if a high EN signal is on line 42, when CK rises, NP2 on line 44 gets pulled low. Because EN on line 42 is high and NCK on line 40 was high, CK therefore goes high, and a path to ground is established by NFETs 46, 48 and 50, and that pulls NP2 line 44 low. Line 44 is connected to an inverter 52 comprised of PFET 54 and NFET 56 with the inverter 52 having output PCK on line 58. When line 44 goes low, the output PCK on line 58 goes high. However long the delay is through the inverter 52, eventually NCK on line 40 will go back low, shutting off the bottom NFET 46 and turning on PFET 60. When NCK on line 40 goes low, that means NP2 on line 44 is pulled back high and output PCK on line 58 will then go low. So the high low sequence occurs on PCK and the duration of the pulse width, the high to low delay, is a direct function of the inverter 52 that generates NCK.

For particular library circuits, it is preferred that only certain modifications can be performed. In the library circuit of FIG. 2, it is modifiable to the extent that only certain transistors can be modified, and those modifiable transistors are NFET 38 and PFET 60. No other FETs in this library circuit can be modified by the designer. Various means of restricting additional modifications can be taken, such as parameterizing the size of the modifiable transistors and no others. This is a capability that is present in some computer aided design (CAD) tools, and CAD tools having this capability are preferred. For example, the Cadence CAD system has an opus editor and schematic capture system that enables the parameterization of aspects of a circuit design, and numerous proprietary CAD systems also have this capability. To implement such parameterization, in hierarchical design, the lowest level (called the "leaf" level) is the only level to contain transistor primitives. Each transistor is sized in the schematic by having a textual width (and optionally length) parameter attached to it. This leaf schematic is then abstracted with a "symbol" that has ports for the inputs and outputs. Traditionally, this symbol is fixed, as is the leaf design underneath. Recently however, CAD tools have enabled the dropping of textual parameters on top of the symbol (as used in the next level up the design hierarchy) to indicate that one of the transistors within the leaf cell should have this new width (or length). This capability has the benefit of avoiding the creation of multiple copies of leaf cells that just differ in the size of their transistors. It is also very attractive for use in the present invention, since transistors can be chosen from a subset of the transistors that can have their sizes changed based on the manner in which it is desired to control changes.

The primary aspect of the circuit of FIG. 2 that can be modified on an individual basis is the width of the resulting output pulse PCK on line 58. This is largely determined by the delay through the inverter 34 of which the NFET 36 is modifiable). On a rising CK edge, NP2 goes low and PCK goes high. Shortly thereafter, NCK goes low, pulling NP2 high with the pull-up PFET 60 resulting in PCK going back low. By modulating the strengths of those two transistors, the width of the pulse can be changed significantly, but other critical aspects of the circuit are unchanged such as output drive strength, input load, delay from CK rise to PCK rise, among other things.

In accordance with the present invention, after such modifications are made, the SPICE circuit simulator is used to check and verify that operation is still acceptable. The SPICE checks for this pulse generator are run to see what the pulse width is, measure that delay in SPICE, and then verify it against the target, then run another simulation that checks the CK to PCK delay and verify that, then run another to look at the enable setup, all of these verify the design guidelines. In doing such checks, one must set the capacitive loads within the range of loads. The pulse generator circuit of FIG. 2 may have to comply with the following predetermined performance specifications:

Performance numbers:
    Pulse width within 5% of the target width
    CK->PCK delay between 35 p and 45 p (p=picoseconds)
    ENABLE falling setup<25 p
    ENABLE rising setup<25 p Robustness:
    pulse height reaches>=80% of Vdd at Vdd=0.6X nom (low voltage scaling)
    NCK must get to within 2% of VDD or we have cycle to cycle performance dependencies.
    Trip points of NCK inverter and the NAND stage within 70 mV (CK edge rate sensitivity)
    6 sigma pulse width variations: min>=0.6×nom, max<=2*nom/3

It is important for running the various SPICE circuit simulator checks that the proper connections of inputs and outputs be made for the particular check being made. The connections file is important because it connects the circuit properly so the SPICE simulations will work properly. Since the circuits can be connected in a variety of ways in accordance with the designer's needs, what the configuration file does is to take the designer's particular implementation and connects its inputs up properly. The SPICE checks are then made, and the results are listed for the design guidelines checks. Such connections are preferably maintained in a connection file for each library circuit being modified, or if no connections file exists, one will need to be created.

Figure 3:
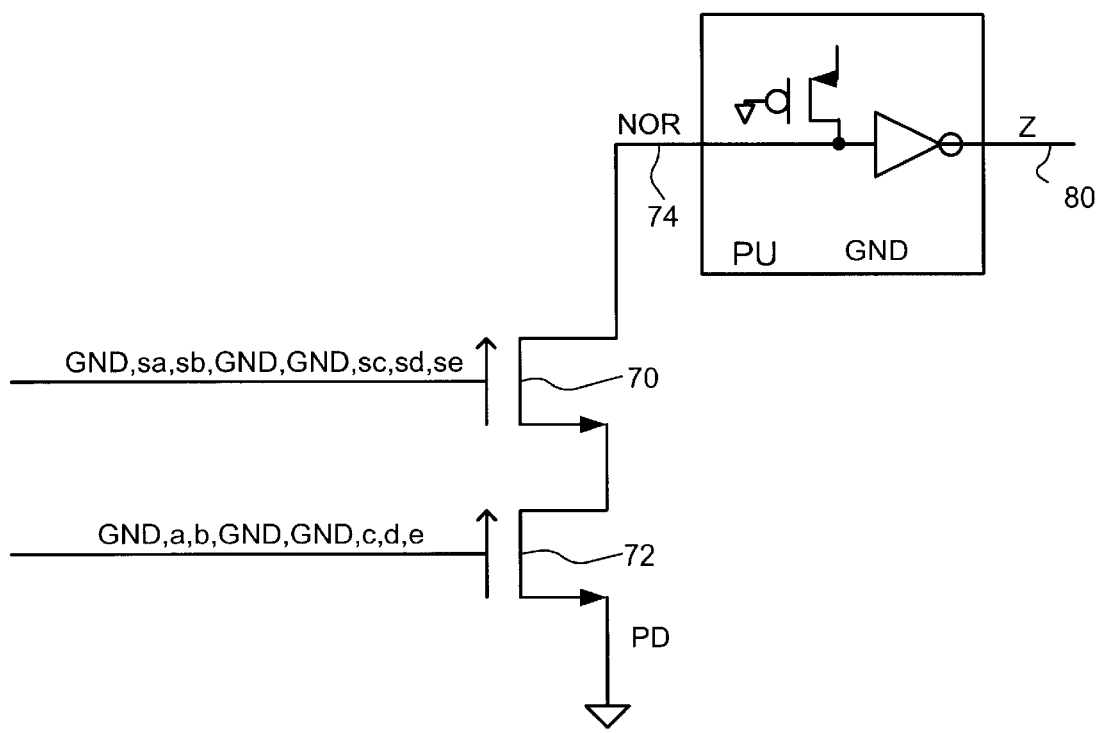
FIG. 3 is an electrical schematic circuit diagram of a pseudo-dynamic gate circuit which can be modified in accordance with the present invention.
Figure 4:
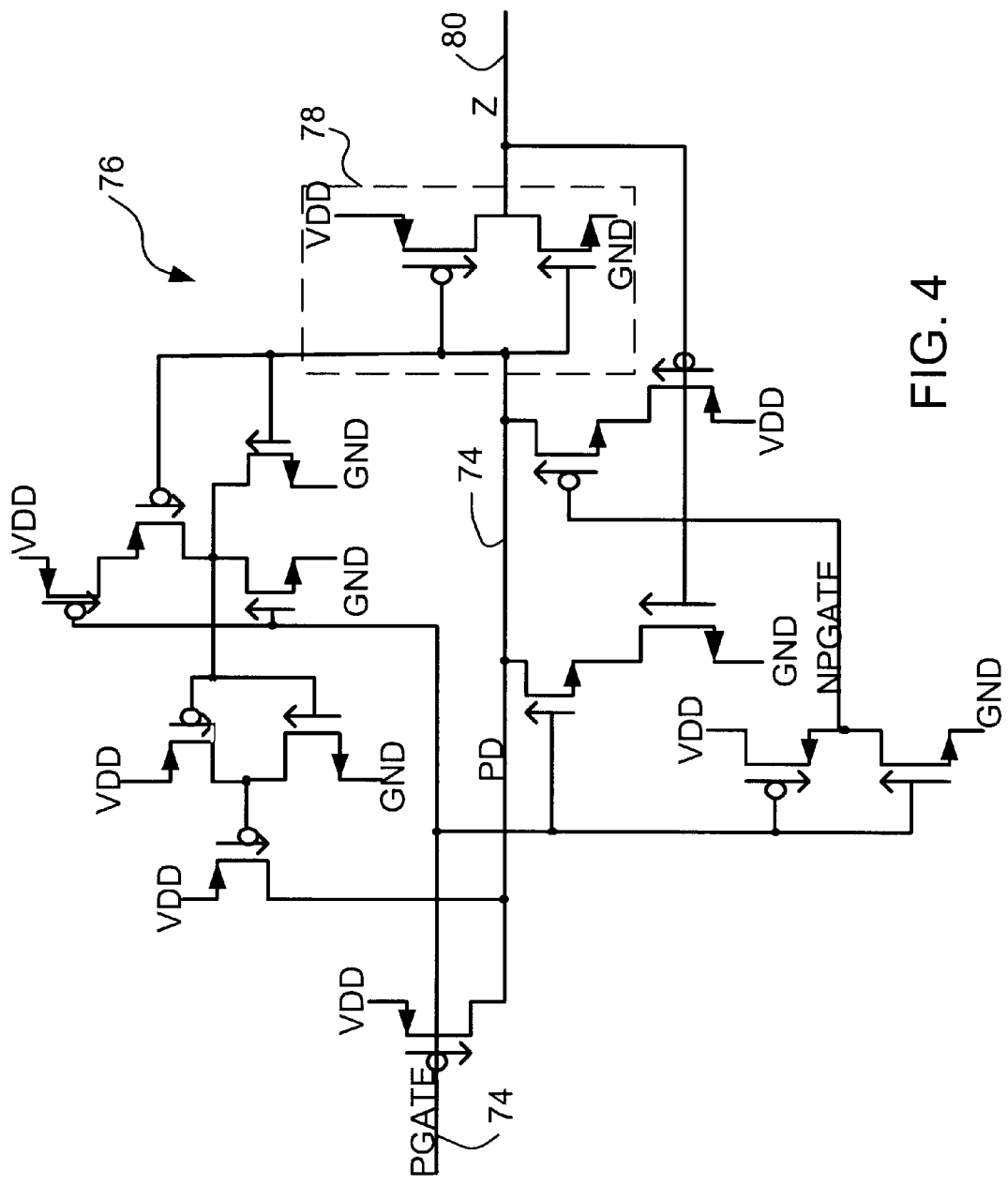
FIG. 4 is an electrical schematic circuit diagram of another pseudo-dynamic gate circuit which can be modified in accordance with the present invention.

To illustrate the type of tests and the manner in which they are done, reference is made to FIG. 3 which is a schematic diagram of a variant of a pseudo-NMOS gate shown in FIG. 1. The circuit of FIG. 1 is a five input multiplexer utilizing a library submultiplexer cell, which has NFETs 14A–F, with a nor node or line 16 providing an input to an inverter 20. In FIG. 3 the inputs are selectively applied to NFETs 70 and 72 and a nor node line 74 is connected to an inverter 76 having a grounded PFET 78 therein and has output Z on line 80. This is essentially the same thing as the pseudo-NMOS gate shown in FIG. 1 if the NPU signal applied to the gate of PFET 24 is ground. The pseudo-NMOS gate has a pull-up PFET 24 connected to NPU, and if that NPU signal is ground, the resulting circuit structure is the same as shown in the pseudo dynamic gate of FIG. 3. The nor node 74 in the connections file is also referred to as the shared node. The drawing of FIG. 4 shows the FETS that are in the inverter 76. The function of all of the components in FIG. 4 is the same as indicated by the grounded PFET inverter, but there are a lot more FETS inside to make the circuit run faster.

Various spice simulations are then run on each of these circuits to check them against predetermined design guidelines. The procedure is to connect up all the inputs such that only one node is pulling down on the storage node 74, and then specify one input as the true INPUT and tie the others to OFF_INPUT. This configuration switches these inputs from High to Low at the same time as the true INPUT is switching from Low to High. The instructions for the connections file then are as follows:

These are the gate connections; add any necessary connections. There should be only ONE, worst case INPUT node active, tie others to OFF_INPUT connections since they must swing for falling delay cases. It may be necessary to try other input nodes to get the worst case.

The format is: <signal name from schematic>= <functional name>
    pull-up PFET gating signal: pgate=PGATE
    Z=OUTPUT
    a=OFF_INPUT
    b=OFF_INPUT
    c=OFF_INPUT
    d=OFF_INPUT
    e=INPUT
    sa=GND
    sb=GND
    sc=GND
    sd=GND
    se=VDD
    VDD=VDD
    GND=GND Unknown nodes: (to connect these, move them above this line
with a connection. e.g. RESET=GND)

Figure 5:
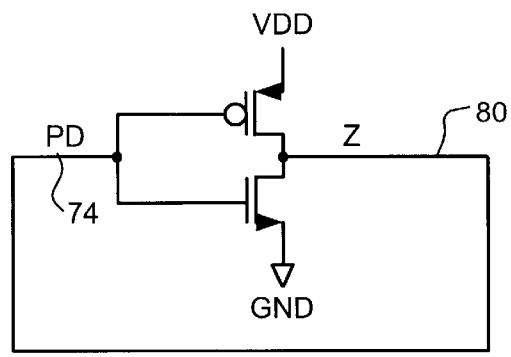
FIG. 5 is an electrical schematic circuit diagram of a portion of the pseudo-dynamic gate circuit which is connected in a slightly different manner to measure certain operational parameters in accordance with the present invention.

When the checking procedure is completed, the SPICE/results file will have either the schematic or artwork based results. An example of results of the checking of the circuits of FIGS. 3 and 4 is shown as follows:

Tue June 20 15:19:50 MDT 2000
        Output trip point: 0.550V
        performance characteristics:
        Rising delay: 93.2 ps Falling delay: 96.0 ps (mismatch: 2.8 ps)
        vol: 193.9 mV trip/vol: 2.84
        Delay pushout due to input glitches:
        0-1-0 pushes out falling output by 9.0 ps (9%) with a 101 ps glitch
        No pushout of rising output
        Checking static operation: passed high, passed low With regard to the results, the receiving inverter 78 trip voltage is measured by connecting the input to the output as shown in FIG. 5. In this case the output inverter trip point is 0.550 Volts. The voltage level of the nor node, labeled PD on line 74 in FIGS. 4 and 5, when the NFETS are pulling down against the PFETS is called vol. In this case, vol is 0.194 Volts.

The ratio of the output inverter gate trip point and the maximum low voltage (with strong feedback on) of the pseudo-NMOS node must be greater than 2.5 to prevent oscillation and static current problems at high Vdd, fast P, slow NFET corners (otherwise known as RTRAN). This additional margin will also help take into account ground bounce at the NFET structure and other sources of noise on the nor node 74. For this configuration the ratio for trip/vol is 2.84.

It is preferable at this point to consider the impact that artwork has on this circuit. Since the NFET pull-down structures are not always placed right next to the PFET pull-up, the IR drop across the nor node 74 needs to be determined. The NFETS in the circuit can sink approximately 1 milliAmp (mA)/micrometer (um) and the PFETS can source 0.5 mA/um. For a total PFET width of 1.58 micrometers, the maximum current across the nor node will be 0.79 mA. If vol plus the IR drop exceeds the trip/(vol+IR) point limit of 2.5, then modifications to fix that would be necessary. For this circuit configuration, vol is 0.194 volts. The largest value that (vol+IR) drop can equal is calculated as follows:

$$\max(vol+IR)=Vtrip/2.5=0.550/2.5=0.220 \text{ volts}$$

$$\text{Max } IR \text{ drop}=0.220-0.194=0.026 \text{ volts}$$

Now calculating the total R that can be handled on the nor node, with the 2.24 um NFETS in series, approximately 1.12 um NFETS sink 1 mA/um equals an effective pull-down of NFETS=1.12 mA. In this case, 1.58 um multiplied by 0.50 mA/um=0.79 mA and the total R=0.026/0.79=33 Ohms. This resistance has to account for the active to m1 contact and for all the metal layers and their vias (holes for providing a conductive connection to a ground plane on the opposite side of the structure). For this particular configuration there are two contacts, one to the NFET pull-downs and one to the PFET. In this case, the contact to the PFET actually helps the problem as part of the IR drop is across the PFET contact, so this will not be included for these calculations. However, all metal vias need to be included in the calculations.

Nominal Active to M1 contact resistance=5 Ohms
    Nominal Metal layer via resistance=5 Ohms
    Assuming Metal 1 only, max resistance=33−5=28 Ohms
    Max distance using minimum M1=42 um
    Assuming Metal 2 only, no M1, max resistance=33−15=18 Ohms
    Where did 15 Ohms come from?
    1 Active to M1 contact for NFET=5 Ohms
    1 M1 to M2 contact to get up to M2=5 Ohms
    1 M2 to M1 contact to get back down=5 Ohms
    Total=15 Ohms
    Max distance using minimum M2, no M1=60 um
    Assuming Metal 3 only, no M1 or M2, max resistance=33−25=8 Ohms
    Max distance using minimum M3, no M2, no M1=28

In the above discussion, it should be understood that active is the diffusion layer in MOS, and that the sources and drains consist of diffusion which is doped silicon. Contacts are usually tungsten plugs that connect the lowest layer of metal (M1) to the diffusion layer. Metal is applied to the silicon and is surrounded by the insulating dielectric. Additional layers of metal are M2 and M3. Vias are holes through the insulating oxide.

If there is a route in M1, M2, and M3 the total resistance of the net will need to be calculated. The results of the above calculations suggest that it is going to be very difficult to route these storage nodes any distance at all. However, multiple things can be done to fix this problem. The number of contacts and vias can be increased. The widths of the metals can be increased, the PFET pull-up size can be adjusted, the NFET pull-down on the far nodes can be changed, and the trip point of the inverter can be altered. The easiest and the best solution for fixing IR drop failures is to move a pull-up PFET away from the receiver circuit. By doing an optimal design, pseudo-dynamic gates can be easily routed in M3 in excess of 650 um. This can be done by increasing both the NFETS and the PFETS. The trip level of the receiver is higher and vol is lower than the above example. The pull-up PFET can be placed at the far end of the nor node away from the inverter, which eliminates the IR drop problems. However, since this node is routed farther it will be more susceptible to noise from coupling and ground bounce. This is why the receiver trip point and vol levels need to be optimized.

Figure 6:
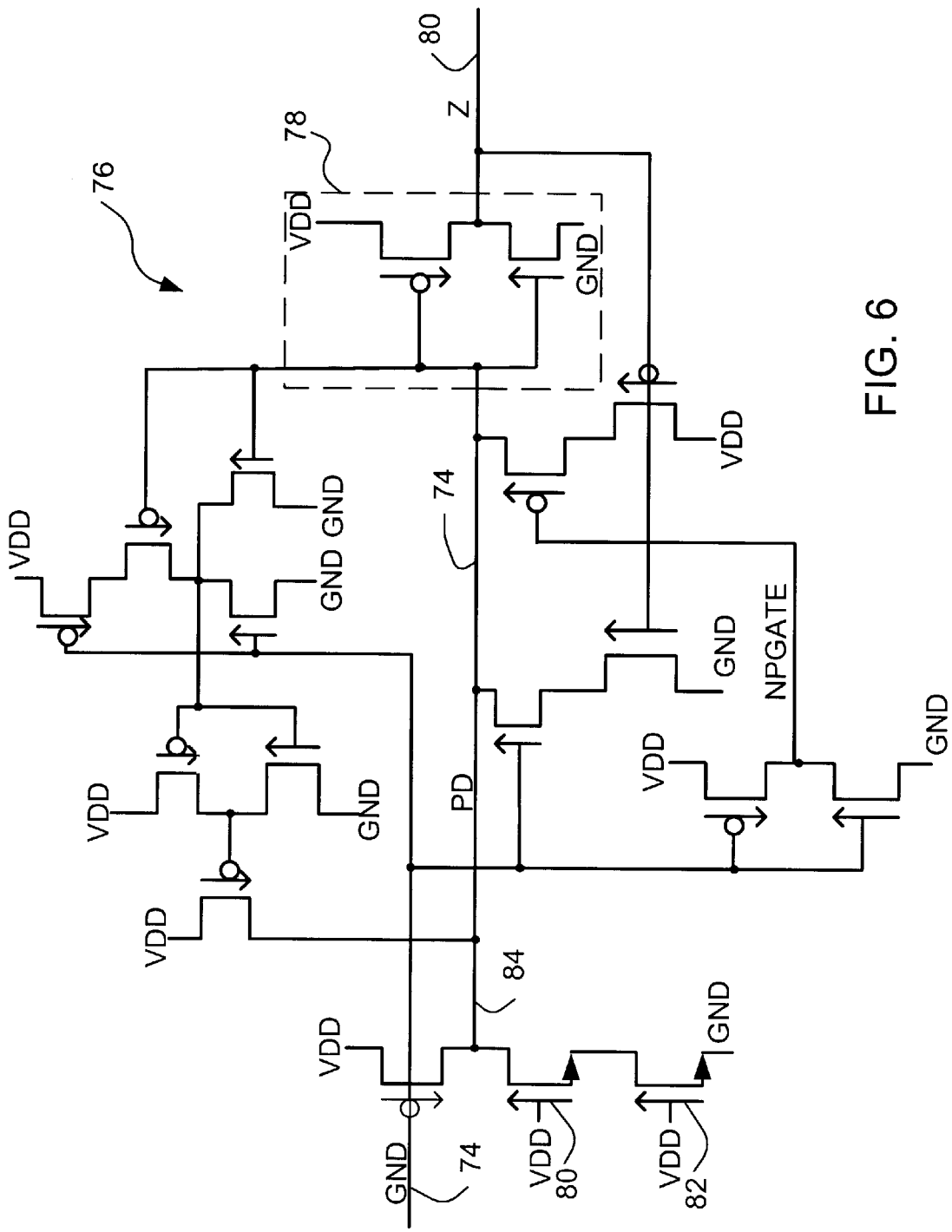
FIG. 6 is an electrical schematic circuit diagram of pseudo-dynamic gate circuit shown in FIG. 4, which has portions modified as necessary to run selected tests with a circuit simulator.

For other circuit checks, it may be necessary to carry out other circuit manipulation. For example, in FIG. 6, the PGATE input on line 74 is ground and added NFETS are present. This configuration of the circuit is used to measure vol, which is the low voltage on the PD node. SPICE is told to configure the circuit in this way to do the vol check. If vol plus the IR drop exceeds the trip/(vol+IR) point limit of 2.5, then it has to be fixed. The premise of this is that since designers can customize these tricky circuits, according to their application, it is necessary to check to see if the circuits still work properly. One of the things a designer can do is to insert unexpected resistance between the pull-down FETS, which in FIG. 6 are the two NFETS 80 and 82 connected to VDD. It is possible on the output between the terminal on the top NFET 80, if there is a resistor there on PD line 84, which could come about by wire capacitance or any number of other ways, since FETS 80 and 82 are going to be sinking current whenever PD is in the low state, it will be sinking current through that resistor, and there will be an IR drop across that resistor, which will add on to the voltage seen on node PD line 84. If there is a large resistance there, PD could then be a higher voltage than was intended for this circuit to operate correctly. That is why this check measures the whole drop to PD—to get a true vol. The vol check is one which checks to confirm that the designer did not break the circuit. To fix it, the resistance can be reduced by using a wider wire, or by moving the NFETS 80 and 82 closer to the rest of the circuitry, so it is not a long route.

It is also desirable to also check whether the gate delay with an input glitch and the static operation of the circuit are acceptable. The gate delay must not push out by more than 1.2× with an input glitch of any magnitude to avoid speed problems with static input hazards. In addition, static operation is checked by ensuring that the nor node can not leak off a zero or one when the PGATE signal is high.

From the foregoing, it should be understood that a method of providing critical circuits in a library of circuits, whereby such critical circuits allows designers to apply modifications to them in a controlled manner such that the changes are easy to implement and virtually guaranteed to be correct. The invention comprises the step of checking the resulting modified circuit with a circuit simulator for conformance to predetermined specifications. The method therefore permits designers to have the ability to reliably modify certain critical circuits in a VLSI or other chip in a manner that can optimize performance and be assured that modifications that are being made will work. Moreover, such flexibility in design can be achieved economically.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

What is claimed is:

1. A method of modifying selected predetermined circuits in the design of a very large scale integrated circuit chip having a large plurality of circuits and wherein the chip is designed using circuits from at least one library of predetermined circuits that can be incorporated into the chip, said method comprising:

enabling limited modifications to the selected predetermined circuit to alter its characteristics in a controlled manner by altering the physical implementation of the circuit components on the silicon of the chip having the circuit, including one or more of selectively changing the wire widths and lengths between transistors, selectively changing the number of vias and contacts that are provided in the circuit, selectively changing the widths and lengths of the transistors while maintaining minimum aspect ratios between the width and length of each transistor, selectively changing the distances between transistors in the circuit; and, verifying the operational performance of the modified circuit using a detailed circuit simulator.

2. A method as defined in claim 1 wherein said limited modifications comprise varying the size of at least one FET in the circuit.

3. A method as defined in claim 1 wherein said limited modifications comprise varying the length of portions of the circuit.

4. A method as defined in claim 1 wherein said limited modifications comprise varying the width of portions of the circuit.

5. A method as defined in claim 1 wherein said circuit simulator comprises a HSPICE simulator.

6. A method as defined in claim 1 wherein the predetermined circuits in the library have predetermined specifications regarding operational performance, said verifying step comprises verifying that the modified circuit conforms to the predetermined specifications regarding operational performance.

7. A method as defined in claim 1 wherein said verifying step applies a set of predetermined checks according to the design specifications of said circuit.

8. A method as defined in claim 1 further comprising the step of performing additional modifications to the selected predetermined circuit to further alter its characteristics in the event the checking revealed the operational performance of the circuit failed to conform to said predetermined specifications.

9. A method of modifying selected predetermined circuits in the design of a very large scale integrated circuit chip having a large plurality of circuits and wherein the chip is designed using circuits from at least one library of predetermined circuits that can incorporated into the chip, the predetermined circuits in the library having predetermined specifications regarding operational performance, said method comprising:

performing limited modifications to the selected predetermined circuit to alter its characteristics in a controlled manner by altering the physical implementation of the circuit components on the silicon of the chip having the circuit, including one or more of selectively changing the wire widths and lengths between transistors, selectively changing the number of vias and contacts that are provided in the circuit, selectively changing the widths and lengths of the transistors while maintaining minimum aspect ratios between the width and length of each transistor, selectively changing the distances between transistors in the circuit;

checking the modified circuit with a detailed circuit simulator for conformance to the predetermined specifications regarding operational performance; and, performing additional modifications to the selected predetermined circuit to further alter its characteristics in the event the checking revealed the operational performance of the circuit failed to conform to said predetermined specifications.

10. A method as defined in claim 9 wherein said limited modifications comprise selectively changing the physical layout of selected components and their interconnection in the circuit to alter the operational characteristics of the components in the circuit.

11. A method as defined in claim 10 wherein changing the physical layout of selected components include changing the size of selected transistors in the circuit.

12. A method as defined in claim 9 wherein said limited modifications comprise selectively adding transistors to the circuit to increase the speed of operation of portions of the circuit.

13. A method as defined in claim 9 wherein said limited modifications comprise parameterizing said modifiable library circuits and permitting only selected portions of the circuits to be modified.

14. A method as defined in claim 13 wherein only selected transistors are permitted to be varied in size.

* * * * *